(12) United States Patent
He et al.

(10) Patent No.: US 6,723,638 B1
(45) Date of Patent: Apr. 20, 2004

(54) PERFORMANCE IN FLASH MEMORY DEVICES

(75) Inventors: Yue-Song He, San Jose, CA (US); Sameer Haddad, San Jose, CA (US); Zhi-Gang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/358,866

(22) Filed: Feb. 5, 2003

(51) Int. Cl.[7] ............................................. H01L 21/44
(52) U.S. Cl. ..................................... 438/663; 438/257
(58) Field of Search ................................ 438/257, 663

(56) References Cited

U.S. PATENT DOCUMENTS

| | | | |
|---|---|---|---|
| 4,698,787 A | 10/1987 | Mukherjee et al. | 365/185 |
| 6,274,429 B1 * | 8/2001 | Misra | 438/257 |
| 6,294,430 B1 * | 9/2001 | Fastow et al. | 438/264 |
| 6,509,228 B1 * | 1/2003 | Sun et al. | 438/257 |

* cited by examiner

Primary Examiner—David Nelms
Assistant Examiner—Thao P. Le

(57) ABSTRACT

In a method of fabricating a semiconductor device, a gate oxide layer is provided on a silicon substrate. A first polysilicon layer is provided on the gate oxide layer, a dielectric layer is provided on the first polysilicon layer, and a second polysilicon layer is provided on the dielectric layer. Upon appropriate masking, an etch step is undertaken, etching the second polysilicon layer, dielectric layer, first polysilicon layer, and gate oxide layer to remove portions thereof to expose the silicon substrate and to form a stacked gate structure on the silicon substrate. A rapid thermal anneal is undertaken for a short period of time, i.e., for example 10–20 seconds, to grow a thin oxide layer on the stacked gate structure. Then, another oxide layer is deposited over the oxide layer which was formed by rapid thermal anneal.

11 Claims, 5 Drawing Sheets

PERFORMANCE IN FLASH MEMORY DEVICES

BACKGROUND OF THE INVENTION

1. Technical Field

This invention relates generally to semiconductor devices, and more particularly, to improved performance of flash memory devices.

2. Background Art

A type of programmable memory cell is commonly referred to as a flash memory cell. Such flash memory cell may include a source and a drain formed in a silicon substrate, or in a well that is formed in the silicon substrate. The flash memory cell includes a stacked gate structure formed on the silicon substrate. The region of the silicon substrate beneath the stacked gate structure is known as the channel region of the flash memory cell.

The stacked gate structure of the flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer, A memory cell of this type is shown and described in U.S. Pat. No. 4,698,787, "Single Transistor Electrically Programmable Memory Device and Method", issued to Mukherjee et al. on Oct. 6, 1987.

Programming operations on a flash memory cell involve the application of a relatively large constant voltage to the drain of the flash memory cell while an even larger voltage is applied to the control gate. During such a programming operation, the source of the flash memory cell is maintained at a ground level or a zero voltage level in relation to the voltages applied to the control gate and drain. The high constant voltage applied to the control gate raises the voltage potential of the floating gate to a high level at the start of the programming operation. Such a high voltage potential on the floating gate attracts the electrons floating through the channel region. Under these conditions, electrons in the channel region having sufficiently high kinetic energy inject through the tunnel oxide layer and onto the floating gate. This phenomenon is commonly referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of the flash memory cell to cause conduction through the channel region during the read operation on the flash memory cell.

In a typical memory array which includes a large number of cells, a cell can be programmed by applying programming voltages of approximately 9–10 volts to the control gate, approximately 5 volts to the drain, and grounding the source. These voltages cause hot electrons to be injected from a drain depletion region into the floating gate. Upon removal of the programming voltages, the injected electrons are trapped in the floating gate and create a negative charge therein that increases the threshold of the cell to a value in excess of approximately 4 volts.

A cell can be read by applying a voltage of approximately 5 volts to the control gate, applying approximately 1 volt to the bit line to which the drain is connected, grounding the source, and sensing the bit line current. If the cell is programmed and the threshold voltage is relatively high (5 volts), the bit line current will be zero or relatively low. If the cell is not programmed or is erased, the threshold voltage will be relatively low (2 volts), the control gate voltage will enhance the channel, and the bit line current will be relatively high.

A cell can be erased in several ways. In one approach, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of −10 volts to the control gate, applying 5 volts to the source and allowing the drain to float can also erase the cell. Another method of erasing a cell is by applying 5 volts to the P well and −10 volts to the control gate while allowing the source and drain to float.

FIGS. 1 and 2 illustrate the formation of a typical stacked gate structure in accord with the prior art. As shown therein, the silicon dioxide layer 10 that will form the tunnel oxide is thermally grown on a silicon substrate 12. Then, a polysilicon layer 14 is provided on the oxide layer 10, a dielectric layer 16, for example, an ONO layer is provided on the polysilicon layer 14, and another polysilicon layer 18 is provided on the dielectric layer 16. A layer of photoresist is provided on the polysilicon layer 18 and is patterned as shown in FIG. 1, leaving photoresist layer portion 20 on the polysilicon layer 18. Then, an etch step is undertaken, using the photoresist layer portion 20 as a mask (FIG. 2), to etch through the polysilicon layer 18, dielectric layer 16, polysilicon layer 14 and oxide layer 10, down to the substrate 12, forming the gate stack 22 which includes tunnel oxide 10A, polysilicon floating gate 14A, dielectric 16A, and polysilicon word line 18A. The photoresist layer portion 20 is then removed.

As is well-known, the etch step used to form the gate stack 22 can cause gouging of the silicon substrate 12 adjacent the gate oxide 10A (see arrows A and B, FIG. 2), which, if allowed to remain in that state, can result in severely degrading erase integrity and erase distribution of the device. In order to reduce this problem, typically, a layer of pre-implant thermal oxide 24 is grown on the top and sides of the gates stack 22 and on the exposed portions of the silicon substrate 12 (FIG. 3), for example to a thickness of 100 angstroms, which substantially reduces or repairs the damage in the substrate 12 described above. Then, ion implantation 26 is undertaken (FIG. 4), using the gate stack 22 and the portions 24A, 24B of the oxide layer 24 on the sides of the gate stack 22 as a mask, to implant the source and drain regions 28, 30 of the device.

Typically, growth of the pre-implant oxide 24 is undertaken for a substantial length of time, for example, five minutes, to a thickness of for example 100 angstroms. Growing the oxide 24 for this length of time has been found to substantially degrade charge carrier mobility in the channel region of the device. This results in a significant core gain drop or drive current drop in the device, clearly a negative effect on device performance. In addition, this lengthy oxidation step has been found to cause oxide regions 32, 34 to be grown into the sides of the floating gate 14A near the bottom thereof (at the sides of the gate stack 22, see FIGS. 3 and 4). These undesired oxide regions 32, 34 can cause significant problems in erase speed of the device.

Therefore, what is needed is an approach which overcomes these problems by providing a pre-implant oxide layer which repairs damage in the substrate caused by the gate stack etch, meanwhile avoiding the problems recited above associated with growing this oxide layer for a substantial period of time.

DISCLOSURE OF THE INVENTION

In the present method of fabricating a semiconductor device, a gate oxide layer is provided on a silicon substrate. A first polysilicon layer is provided on the gate oxide layer, a dielectric layer is provided on the first polysilicon layer, and a second polysilicon layer is provided on the dielectric layer. Upon appropriate masking, and etch step is undertaking, etching the second polysilicon layer, dielectric layer, first polysilicon layer, and gate oxide layer to remove portions thereof to expose the silicon substrate and to form a stacked gate structure on the silicon substrate. A rapid thermal anneal is undertaken for a short period of time to grow a thin oxide layer on the stacked gate structure. Then, another oxide layer is deposited over the oxide layer which was formed by rapid thermal anneal.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
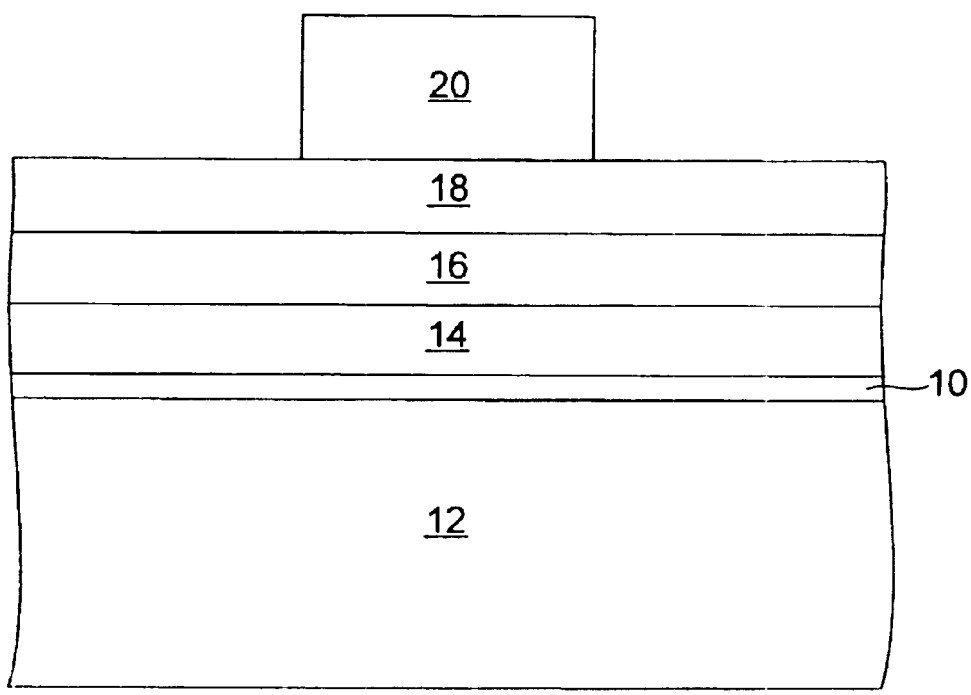
FIGS. 1–4 illustrate steps in a typical prior art process.
Figure 2:
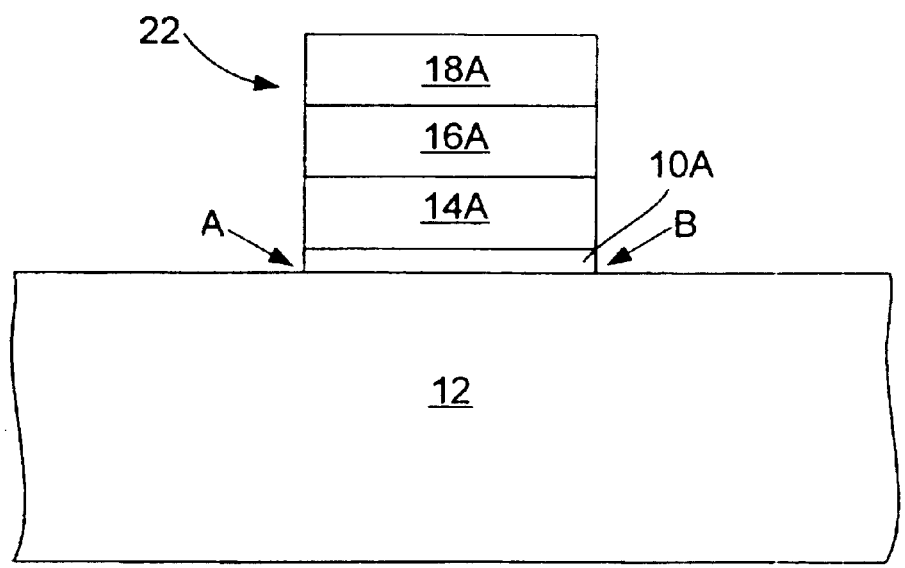
Figure 3:
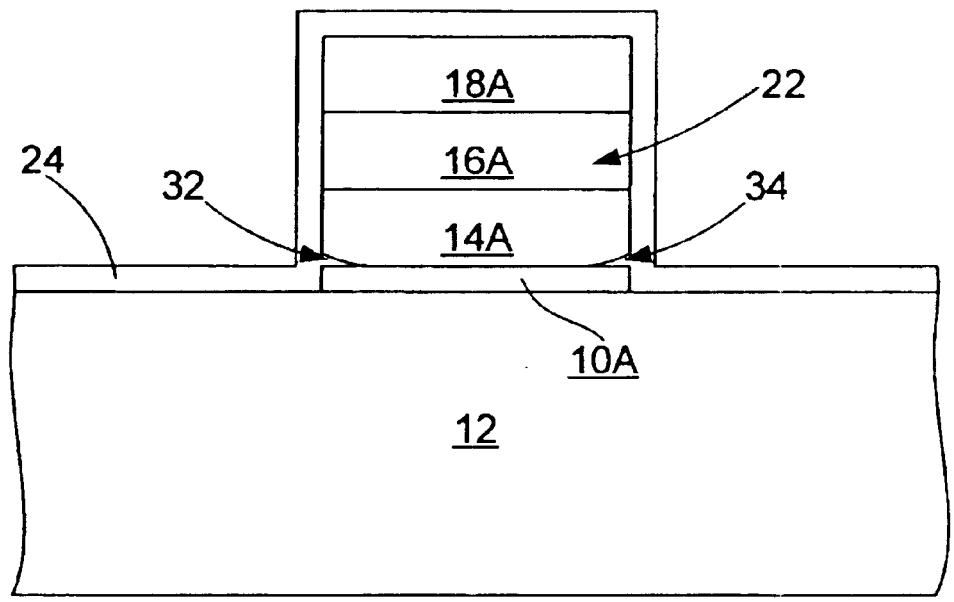
Figure 4:
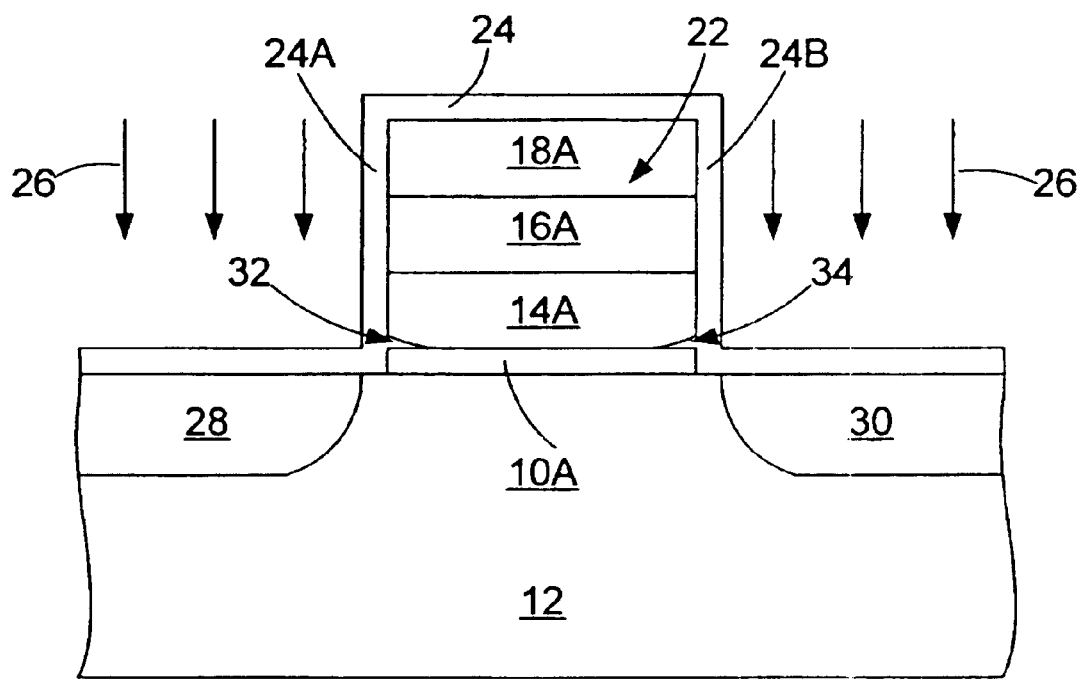
Figure 5:
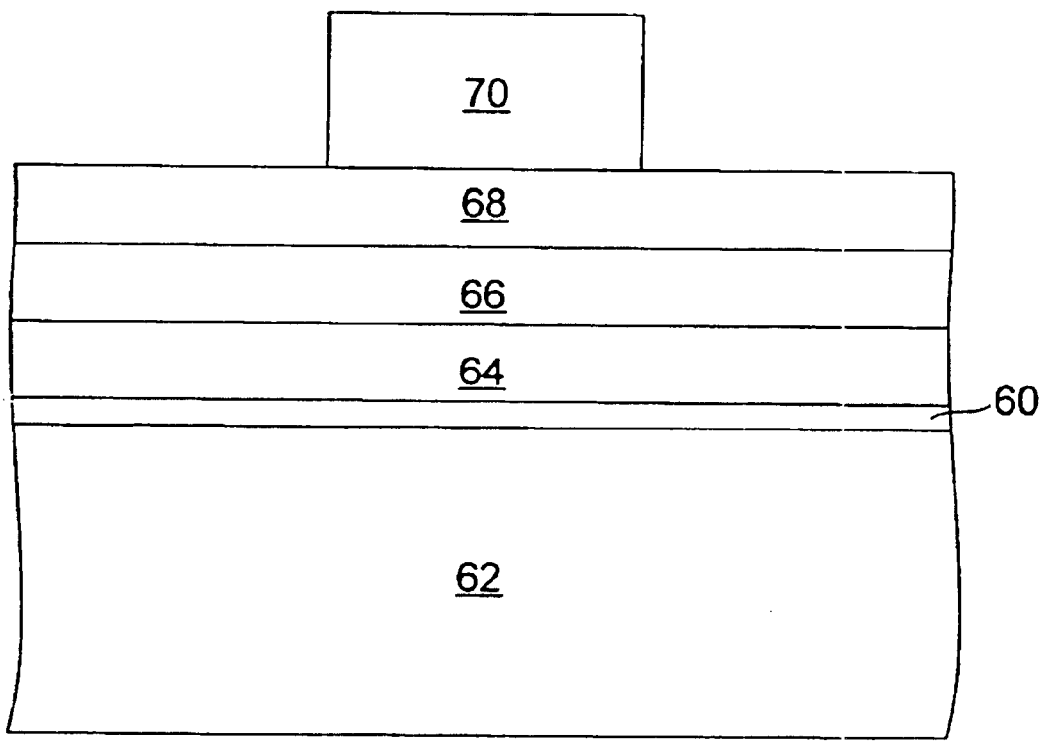
FIGS. 5–9 illustrate steps in accordance with the present invention.
Figure 6:
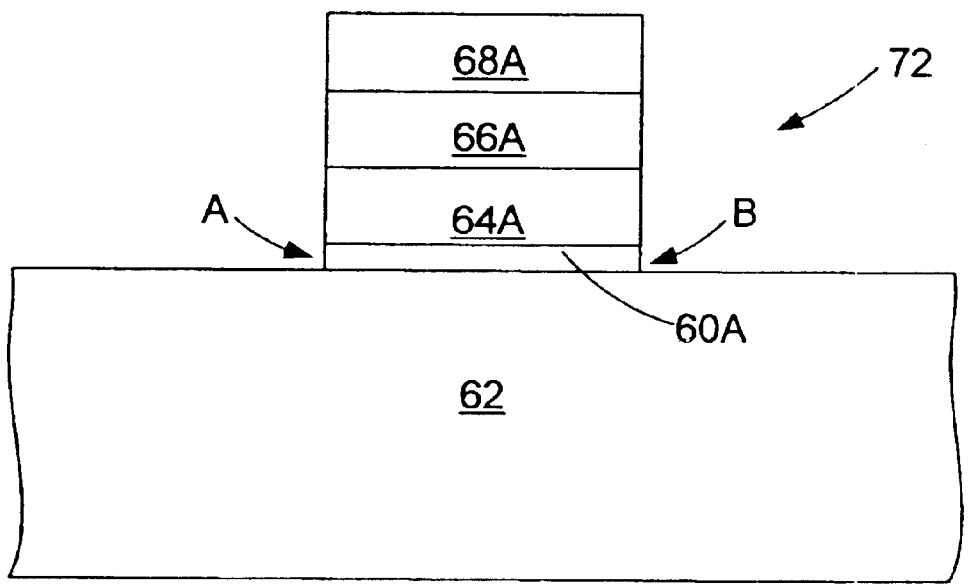

FIGS. 5 and 6 illustrate steps in the present process identical to that shown in previously described FIGS. 1 and 2. That is, in forming a stacked gate structure, the silicon dioxide layer 60 that will form the tunnel oxide is thermally grown on a silicon substrate 62. Then, a polysilicon layer 64 is provided on the oxide layer 60, a dielectric layer 66, for example, an ONO layer is provided on the polysilicon layer 64, and another polysilicon layer 68 is provided on the dielectric layer 66. A layer of photoresist is provided on the polysilicon the layer 18 and is patterned as shown in FIG. 1, leaving photoresist layer portion 70 on the polysilicon layer 68. Then, similar to the above description, an etch step is undertaken, using the photoresist layer portion 70 as a mask (FIG. 5), to etch through the polysilicon layer 68, dielectric layer 66, polysilicon layer 64 and oxide layer 60, down to the substrate 62, forming gate stack 72 which includes tunnel oxide 60A on substrate 62, polysilicon floating gate 64A on tunnel oxide 60A, dielectric 66A on polysilicon floating gate 64A, and polysilicon word line 68A on dielectric 66A.

As described above, this etch step forming the gate stack 72 can cause gouging of the silicon substrate 62 adjacent the gate stack 72 (see arrows A and B, FIG. 6), which, if not repaired, can cause significant device performance degradation.

Figure 7:
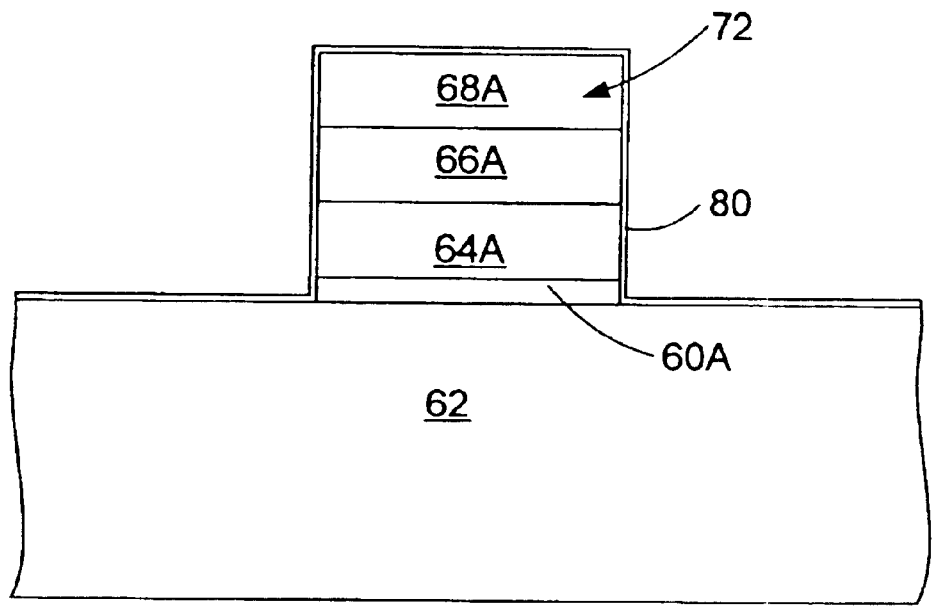
Figure 8:
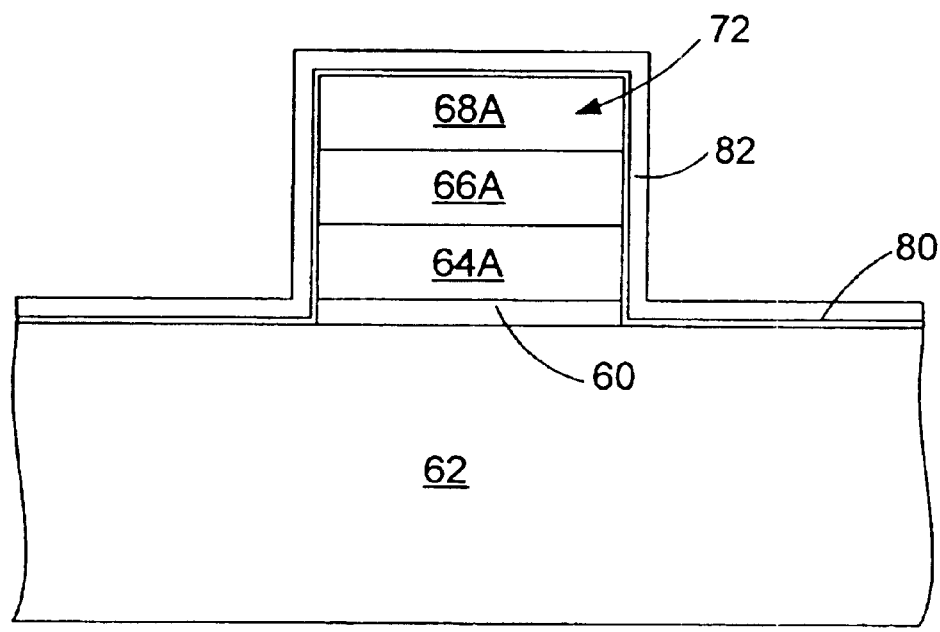
Figure 9:
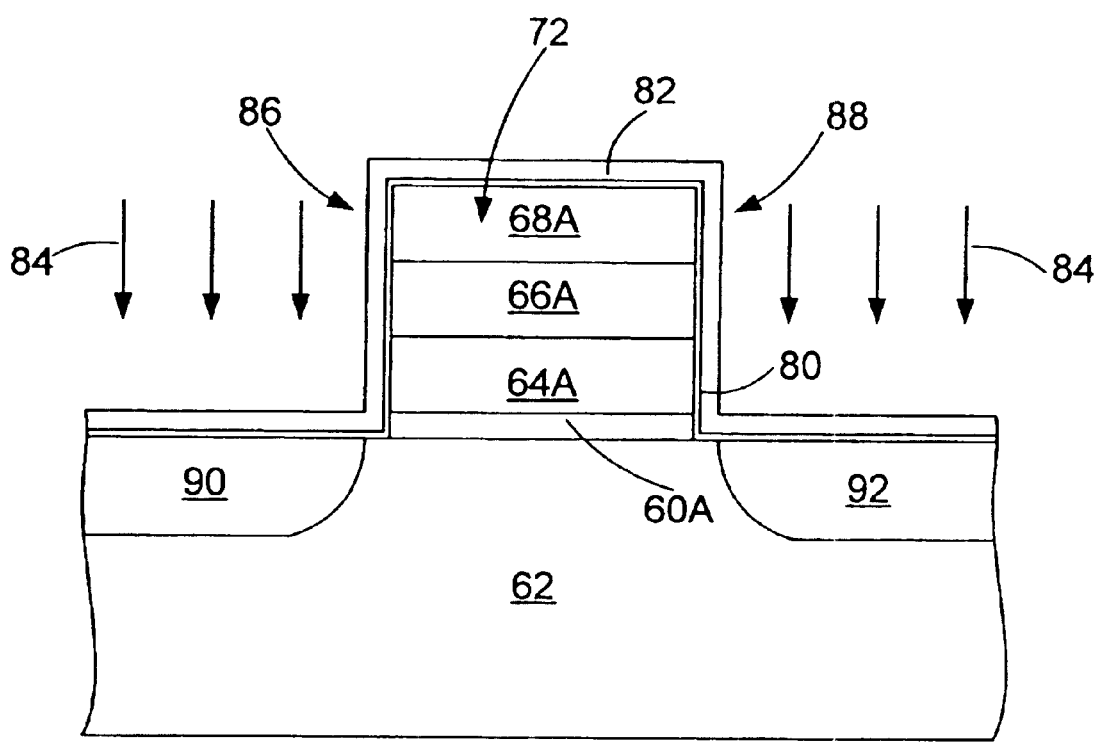

However, after removal of photoresist layer portion 70, instead of thermally growing a pre-implant oxide layer to deal with this problem as described above, a rapid thermal anneal is undertaken for a short period of time, i.e., for example 10–20 seconds at 900–1000° C. to form a thin oxide layer 80 less than 20 angstroms, for example 10 angstroms thick, on the top and sides of the gate stack 72 and on the exposed portions of the silicon substrate 62 (FIG. 7). Then, an oxide deposition step is undertaken (FIG. 8), wherein an oxide layer 82 is deposited on oxide layer 80, of sufficient thickness to increase the overall or total thickness of the oxide layer 80 formed by rapid thermal anneal and the deposited oxide layer 82 to approximately 100 angstroms. Then, ion implantation is undertaken 84 (FIG. 9), using the gate stack and the oxide 86, 88 on the sides of the gate stack 72 as a mask, to implant the source and drain regions 90, 92 of the device.

Formation of the oxide layer 80 by rapid thermal anneal repairs and reduces the substrate 62 gouging damage adjacent the gate oxide 64A, as is desirable. In addition, this rapid thermal anneal is undertaken for a short period of time, for example, 10–20 seconds, as compared to 5 minutes for growth of the 100 angstrom thick thermally grown oxide 24 of the prior art. This avoids the problem of reduced carrier mobility in the channel region of the device as described above with regard to the prior art, which problem resulted from the substantial length of time involved in growing the oxide layer 24. In addition, with such a short rapid thermal anneal time, the growing of oxide regions (as at 32, 34, described above) into the body of the floating gate 64A at the sides of the gate stack 72, and the problems attendant thereto as described above, are avoided.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a semiconductor device comprising:

providing a substrate;

providing a stacked gate structure on the substrate; and forming an oxide layer on the stacked gate structure by annealing.

2. The method of claim 1 wherein the oxide layer formed by annealing is formed on at least the sides of the stacked gate structure.

3. The method of claim 2 wherein the oxide layer formed by annealing is formed by rapid thermal anneal.

4. The method of claim 3 wherein the substrate is a silicon substrate.

5. The method of claim 4 and further comprising the step of depositing an oxide layer over the oxide layer formed by annealing.

6. A method of fabricating a semiconductor device comprising:

provideing a silicon substrate;

providing a gate oxide layer on the silicon substrate;

providing a first polysilicon layer on the gate oxide layer;

providing a dielectric layer on the first polysilicon layer;

providing a second polysilicon layer on the dielectric layer;

etching the second polysilicon layer, dielectric layer, first polysilicon layer, and gate oxide layer to remove portions thereof to expose the silicon substrate and to form a stacked gate structure on the silicon substrate; and undertaking a rapid thermal anneal to grow an oxide layer on the stacked gate structure.

7. The method of claim 6 wherein the step of undertaking a thermal rapid anneal grows an oxide layer on at least the sides of the stacked gate structure.

8. The method of claim 7 wherein the step of rapid thermal anneal is undertaken for a period of from 10 to 20 seconds.

9. The method of claim 8 wherein the step of rapid thermal anneal is undertaken at a temperature of from 900 to 1000° C.

10. The method of claim 9 wherein the oxide layer grown by rapid thermal anneal is less than 20 angstroms in thickness.

11. The method of claim 7 and further comprising the step of depositing an oxide layer over the oxide layer by rapid thermal anneal.

* * * * *